(12) United States Patent
Akel

(10) Patent No.: US 11,621,029 B2
(45) Date of Patent: Apr. 4, 2023

(54) MEMORY DEVICES WITH SELECTIVE PAGE-BASED REFRESH

(71) Applicant: Micron Technology, Inc., Boise, ID (US)

(72) Inventor: Ameen D. Akel, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/539,052

(22) Filed: Nov. 30, 2021

(65) Prior Publication Data

US 2022/0084582 A1 Mar. 17, 2022

Related U.S. Application Data

(63) Continuation of application No. 16/926,582, filed on Jul. 10, 2020, now Pat. No. 11,200,938, which is a
(Continued)

(51) Int. Cl.
*G11C 11/40* (2006.01)
*G11C 11/406* (2006.01)
(Continued)

(52) U.S. Cl.
CPC .... *G11C 11/40615* (2013.01); *G11C 11/1675* (2013.01); *G11C 11/22* (2013.01);
(Continued)

(58) Field of Classification Search
None
See application file for complete search history.

(56) References Cited

U.S. PATENT DOCUMENTS

| 7,663,933 B2 | 2/2010 | Tsukazaki et al. |
| 7,975,170 B2 | 7/2011 | Hummler et al. |

(Continued)

FOREIGN PATENT DOCUMENTS

| CN | 104298610 A | 1/2015 |
| CN | 106775441 A | 5/2017 |

(Continued)

OTHER PUBLICATIONS

EP Patent Application No. 18838907.6—Extended European Search Report, dated Mar. 22, 2021, 9 pages.
(Continued)

*Primary Examiner* — Tan T. Nguyen
(74) *Attorney, Agent, or Firm* — Perkins Coie LLP

(57) ABSTRACT

Several embodiments of memory devices and systems with selective page-based refresh are disclosed herein. In one embodiment, a memory device includes a controller operably coupled to a main memory having at least one memory region comprising a plurality of memory pages. The controller is configured to track, in one or more refresh schedule tables stored on the memory device and/or on a host device, a subset of memory pages in the plurality of memory pages configured to be refreshed according to a refresh schedule. In some embodiments, the controller is further configured to refresh the subset of memory pages in accordance with the refresh schedule.

20 Claims, 8 Drawing Sheets

Related U.S. Application Data continuation of application No. 16/456,493, filed on Jun. 28, 2019, now Pat. No. 10,748,598, which is a continuation of application No. 16/019,483, filed on Jun. 26, 2018, now Pat. No. 10,431,289, which is a continuation of application No. 15/663,641, filed on Jul. 28, 2017, now Pat. No. 10,109,339.

(51) Int. Cl.
*G11C 11/22* (2006.01)
*G11C 11/16* (2006.01)
*G11C 11/408* (2006.01)
*G11C 13/00* (2006.01)

(52) U.S. Cl.
CPC ........ *G11C 11/2275* (2013.01); *G11C 11/408* (2013.01); *G11C 13/0033* (2013.01); *G11C 11/406* (2013.01); *G11C 11/40603* (2013.01); *G11C 11/40618* (2013.01); *G11C 13/0004* (2013.01); *G11C 13/0016* (2013.01)

(56) References Cited

U.S. PATENT DOCUMENTS

| | | | |
|---|---|---|---|
| 8,495,438 | B2 | 7/2013 | Roine |
| 10,109,339 | B1 | 10/2018 | Akel |
| 10,431,289 | B2 | 10/2019 | Akel |
| 10,748,598 | B2 | 8/2020 | Akel |
| 2004/0090853 | A1 | 5/2004 | Perner |
| 2007/0030746 | A1 | 2/2007 | Best et al. |
| 2007/0030747 | A1 | 2/2007 | Hirai et al. |
| 2007/0183242 | A1 | 8/2007 | Miyamoto |
| 2008/0025122 | A1 | 1/2008 | Schakel et al. |
| 2008/0259708 | A1 | 10/2008 | Tsukazaki et al. |
| 2008/0313494 | A1 | 12/2008 | Hummler et al. |
| 2009/0040167 | A1 | 2/2009 | Sun |
| 2009/0172267 | A1* | 7/2009 | Oribe ................. G11C 16/3418 711/E12.008 |
| 2011/0047347 | A1 | 2/2011 | Li et al. |
| 2011/0255360 | A1* | 10/2011 | Takahashi ............. G11C 11/406 365/219 |
| 2012/0099389 | A1 | 4/2012 | Park et al. |
| 2013/0279283 | A1 | 10/2013 | Seo et al. |
| 2014/0016421 | A1 | 1/2014 | Kim et al. |
| 2014/0146624 | A1 | 5/2014 | Son et al. |
| 2014/0169114 | A1 | 6/2014 | Oh et al. |
| 2014/0254298 | A1* | 9/2014 | Dally ................. G11C 11/40622 365/222 |
| 2015/0016203 | A1 | 1/2015 | Sriramagiri et al. |
| 2015/0016204 | A1 | 1/2015 | Dong et al. |
| 2015/0218992 | A1 | 8/2015 | Yezerets et al. |
| 2015/0221362 | A1 | 8/2015 | Jeong |
| 2015/0318035 | A1 | 11/2015 | Dong et al. |
| 2016/0012880 | A1 | 1/2016 | Kim et al. |
| 2016/0133314 | A1 | 5/2016 | Hwang et al. |
| 2016/0180917 | A1* | 6/2016 | Chishti ............. G11C 11/40615 365/222 |
| 2017/0262192 | A1 | 9/2017 | Aga et al. |
| 2018/0095971 | A1 | 4/2018 | Kedia et al. |
| 2019/0035453 | A1 | 1/2019 | Akel |
| 2019/0318779 | A1 | 10/2019 | Akel |
| 2020/0050396 | A1 | 2/2020 | Keil |
| 2020/0342933 | A1 | 10/2020 | Akel |

FOREIGN PATENT DOCUMENTS

| | | |
|---|---|---|
| TW | I587135 B | 6/2017 |
| TW | I592800 B | 7/2017 |

OTHER PUBLICATIONS

International Application No. PCT/US2018/042397—International Search Report and Written Opinion, dated Oct. 25, 2018, 19 pages.
Office Action dated May 25, 20215 for Korean Patent Application No. 10-2020-7005042; 10 pages (with translation).
TW Patent Application No. 107125996—Taiwanese Office Action and Search Report, dated Jun. 28, 2019, with English Translation, 14 pages.
Notice of Reasons for Rejection dated Apr. 14, 2022 for Korean Patent Application No. 10-2022-7003002, 4 pages.

* cited by examiner

244a

| Memory Region | Memory Block | No Refresh Range |
|---|---|---|
| 1 | 1 | $p_{39} - p_{54}$ |
| | 2 | |
| | 3 | $p_{16} - p_{24}; p_{43} - p_{47}$ |
| | ⋮ | ⋮ |
| | m-2 | $p_{1} - p_{14}$ |
| | m-1 | $p_{25} - p_{38}$ |
| | m | $p_{51} - p_{64}$ |
| 2 | ⋮ | ⋮ |
| 3 | ⋮ | ⋮ |
| ⋮ | ⋮ | ⋮ |
| n-2 | ⋮ | ⋮ |
| n-1 | ⋮ | ⋮ |
| n | ⋮ | ⋮ |

| Memory Region | Memory Block | Refresh Range |
|---|---|---|
| 1 | 1 | $p_1 - p_{39}; p_{55} - p_{64}$ ← 351 |
| | 2 | $p_1 - p_{64}$ ← 352 |
| | 3 | $p_1 - p_{15}; p_{25} - p_{42}; p_{48} - p_{64}$ ← 353 |
| | ⋮ | ⋮ |
| | m-2 | $p_{15} - p_{64}$ ← 355 |
| | m-1 | $p_1 - p_{24}; p_{39} - p_{64}$ ← 356 |
| | m | $p_1 - p_{50}$ ← 357 |
| 2 | ⋮ | ⋮ |
| 3 | ⋮ | ⋮ |
| ⋮ | ⋮ | ⋮ |
| n-2 | ⋮ | ⋮ |
| n-1 | ⋮ | ⋮ |
| n | ⋮ | ⋮ |

| Memory Region | Memory Block | Refresh Range |
|---|---|---|
| 1 | 1 | $p_1, 39; p_{55}, 10$ |
| | 2 | $p_1, 64$ |
| | 3 | $p_1, 15; p_{25}, 18; p_{48}, 17$ |
| | ⋮ | ⋮ |
| | m-2 | $p_{15}, 50$ |
| | m-1 | $p_1, 24; p_{39}, 26$ |
| | m | $p_1, 50$ |
| 2 | ⋮ | ⋮ |
| 3 | ⋮ | ⋮ |
| ⋮ | ⋮ | ⋮ |
| n-2 | ⋮ | ⋮ |
| n-1 | ⋮ | ⋮ |
| n | ⋮ | ⋮ |

MEMORY DEVICES WITH SELECTIVE PAGE-BASED REFRESH

CROSS-REFERENCE TO RELATED APPLICATION

This application is a continuation of U.S. application Ser. No. 16/926,582, filed Jul. 10, 2020, now U.S. Pat. No. 11,200,938, which is a continuation of U.S. application Ser. No. 16/456,493, filed Jun. 28, 2019, now U.S. Pat. No. 10,748,598; which is a continuation of U.S. application Ser. No. 16/019,483, filed Jun. 26, 2018, now U.S. Pat. No. 10,431,289; which is a continuation of U.S. application Ser. No. 15/663,641, filed Jul. 28, 2017, now U.S. Pat. No. 10,109,339; each of which is incorporated herein by reference in its entirety.

TECHNICAL FIELD

The disclosed embodiments relate to memory devices and systems, and, in particular, to memory devices with selective page-based refresh.

BACKGROUND

Memory devices are frequently provided as internal, semiconductor, integrated circuits and/or external removable devices in computers or other electronic devices. There are many different types of memory, including volatile and non-volatile memory. Volatile memory may require a source of applied power to maintain its data and is available in a wide-variety of technologies, including random-access memory (RAM), dynamic random access memory (DRAM), and synchronous dynamic random access memory (SDRAM), among others. Volatile memory stores information that is frequently accessed by a memory controller during operation, and it often exhibits faster read and/or write times than non-volatile memory. Non-volatile memory, by contrast, can retain its stored data even when not externally powered. Non-volatile memory is also available in a variety of technologies, including flash memory (e.g., NAND and NOR), phase change memory (PCM), resistive random access memory (RRAM), ferroelectric random access memory (FeRAM or FRAM), and magnetic random access memory (MRAM), among others.

One drawback of some non-volatile memory technologies (e.g., ferroelectric memory, polymer memory, etc.) is that these technologies can suffer from imprint when their memory cells remain in the same data state for a prolonged period of time. When a data state becomes imprinted into a memory cell, the memory cell tends to retain that data state even when the memory controller attempts to erase the memory cell and/or program it to a different data state. Thus, these imprint-prone memory technologies must be periodically refreshed (e.g., by changing the polarity and/or the data state in the memory cells) to prevent data states from imprinting into the memory cells. The number of refreshes required for these non-volatile memory technologies, however, can consume a large amount of energy and a large amount of the active time of the memory, especially as memory technologies become more dense.

BRIEF DESCRIPTION OF THE DRAWINGS

FIGS. 2A and 2B are tables illustrating selective page-based refresh in accordance with several embodiments of the present technology.

FIGS. 3A and 3B are tables illustrating selective page-based refresh in accordance with several embodiments of the present technology.

DETAILED DESCRIPTION

As described in greater detail below, the present technology relates to memory devices and related systems with selective page-based refresh. A person skilled in the art, however, will understand that the technology may have additional embodiments and that the technology may b e practiced without several of the details of the embodiments described below with reference to FIGS. 1-6. In the illustrated embodiments below, the memory devices are primarily described in the context of devices incorporating ferroelectric storage media. Memory devices configured in accordance with other embodiments of the present technology, however, can include other types of storage media, such as NAND, NOR, PCM, RRAM, MRAM, read only memory (ROM), erasable programmable ROM (EROM), electrically erasable programmable ROM (EEROM), and other storage media, including volatile storage media.

One embodiment of the present technology is a memory device comprising a controller and a main memory. The main memory includes a memory region having a plurality of memory pages. The controller is operably coupled to the main memory and is configured to track a first subset and a second subset of the plurality of memory pages in the main memory having a first imprint-refresh schedule and a second refresh imprint-refresh schedule, respectively. The controller is further configured to refresh the first subset and the second subset of the plurality of memory pages in accordance with the corresponding first and second imprint-refresh schedules.

An imprint-refresh schedule may be used to dictate how often a memory page is refreshed to counter imprint effects. In this manner, energy consumed and active time of the memory device spent on refreshing memory pages within the memory device can be managed according to the classification and/or type (e.g., refresh, no-refresh, very-frequent refresh, frequent refresh, occasional refresh, etc.) of the memory pages.

Figure 1:
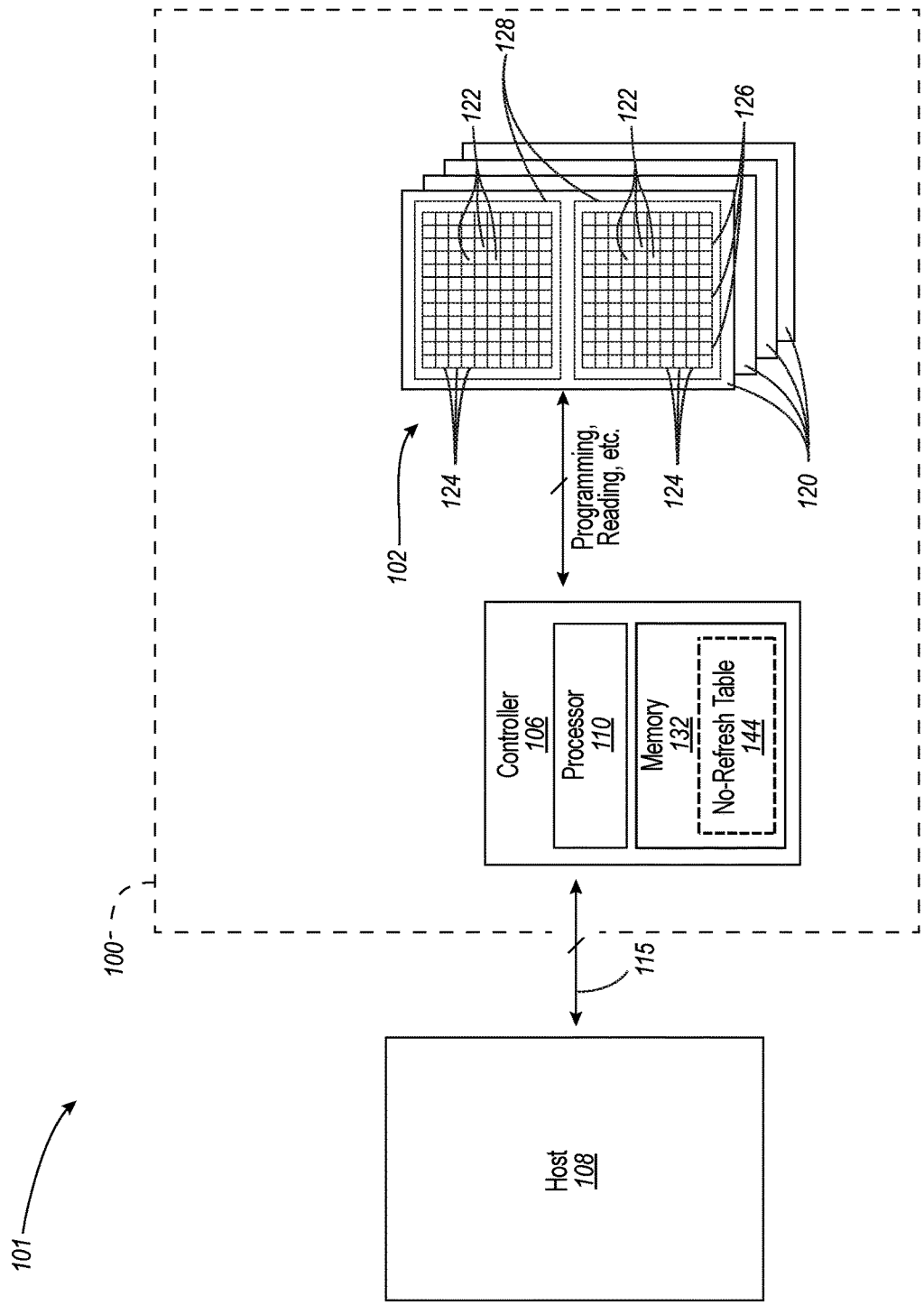
FIG. 1 is a block diagram of a system having a memory device configured in accordance with an embodiment of the present technology.

FIG. 1 is a block diagram of a system 101 having a memory device 100 configured in accordance with an embodiment of the present technology. As shown, the memory device 100 includes a main memory 102 and a controller 106 operably coupling the main memory 102 to a host device 108 (e.g., an upstream central processor (CPU)). The main memory 102 includes a plurality of memory regions, or memory units 120, which include a plurality of memory cells 122. Memory units 120 can be individual memory dies, memory planes in a single memory die, a stack of memory dies vertically connected with through-silicon vias (TSVs), or the like. In one embodiment, each of the memory units 120 can be formed from a semiconductor die and arranged with other memory unit dies in a single device package (not shown). In other embodiments, one or more of the memory units 120 can be co-located on a single die and/or distributed across multiple device packages. The memory cells 122 can include, for example, ferroelectric and/or other suitable storage elements (e.g., capacitive, phase change, magnetoresistive, etc.) configured to store data persistently or semi-persistently. The main memory 102 and/or the individual memory units 120 can also include other circuit components (not shown) (e.g., memory subsystems), such as multiplexers, decoders, buffers, read/write drivers, address registers, data out/data in registers, etc., for accessing and/or programming (e.g., writing) the memory cells 122 and other functionality, such as for processing information and/or communicating with the controller 106.

Memory cells 122 can be arranged in rows 124 (e.g., each corresponding to a word line) and columns 126 (e.g., each corresponding to a bit line). Each word line 124 can span one or more memory pages, depending upon the number of data states the memory cells 122 of that word line 124 are configured to store. In the illustrated embodiment, for example, the memory cells 122 can be ferroelectric memory cells that are each configured to store one of two data states, and a single word line 124 can span a single memory page. In other embodiments with memory cells configured to store more than two data states (e.g., four, eight, or more data states), a single word line 124 can span two or more memory pages. In these and other embodiments, memory pages can be interleaved so that a word line 124 comprised of memory cells 122 configured to store one of two data states in each cell can span two memory pages. For example, the word lines 124 can be arranged in an "even-odd bit line architecture," where, e.g., all the memory cells 122 in odd-numbered columns 126 of a single word line 124 are grouped as a first memory page, and all the memory cells 122 in even-numbered columns 126 of the same word line 124 are grouped as a second memory page. When even-odd bit line architecture is utilized in a word line 124 of memory cells 122 that store larger numbers of data states in each cell, the number of memory pages per word line 124 can be even higher (e.g., 4, 6, 8, etc.).

In other embodiments, the memory cells 122 can be arranged in different types of groups and/or hierarchies than those shown in the illustrated embodiments. Further, while shown in the illustrated embodiments with a certain number of memory cells, rows, columns, blocks, and memory units for purposes of illustration, in other embodiments, the number of memory cells, rows, columns, blocks, and memory units can vary, and can be larger or smaller in scale than shown in the illustrated examples. For example, in some embodiments, the memory device 100 can include only one memory unit 120. Alternatively, memory device 100 can include two, three, four, eight, ten, or more (e.g., 16, 12, 64, or more) memory units 120. While the memory units 120 are shown in FIG. 1 as including two memory blocks 128 each, in other embodiments, each memory unit 120 can include one, three, four, eight, or more (e.g., 16, 32, 64, 100, 128, 256 or more) memory blocks 128. In some embodiments, each memory block 128 can include, e.g., $2^{15}$ memory pages, and each memory page within a block can include, e.g., $2^{12}$ memory cells 122.

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory. In the illustrated example, the memory of the controller 106 includes an embedded memory 132 configured to store various processes, logic flows, and routines for controlling operation of the memory device 100, including managing the main memory 102 and handling communications between the memory device 200 and the host device 108. In some embodiments, the embedded memory 132 can include memory registers storing, e.g., memory pointers, fetched data, etc. The embedded memory 132 can also include read-only memory (ROM) for storing micro-code. While the exemplary memory device 100 illustrated in FIG. 1 includes a controller 106, in another embodiment of the present technology, a memory device may not include a controller, and may instead rely upon external control (e.g., provided by an external host, or by a processor or controller separate from the memory device).

In operation, the controller 106 can directly read, write, or otherwise program (e.g., erase) the various memory regions of the main memory 102, such as by reading from and/or writing to groups of memory pages and/or memory blocks 128. In FRAM-based and other memory types, a write operation often includes programming the memory cells 122 in selected memory pages with specific polarities representing data values (e.g., a string of data bits each having a value of either logic 0 or logic 1). An erase operation is similar to a write operation, except that the erase operation re-programs the memory cells 122 to a specific polarity and data state (e.g., logic 0).

The controller 106 communicates with the host device 108 over a host-device interface 115. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation).

As discussed above, the memory cells 122 can suffer from imprint when they remain in the same polarity and/or data state for a prolonged period of time. To counteract this effect, the controller 106 and/or the main memory 102 can periodically refresh the memory cells 122 (e.g., by reversing their polarity or otherwise changing their data state). The number of refreshes required, however, can consume a large amount of energy and a large amount of the active time of the memory device 100, especially as the number of memory cells 122 within the main memory 102 increases. Furthermore, not all of the memory cells 122 within the main memory 102 need to be refreshed at the same rate. For example, several of the memory cells 122 within the main memory 102 can be grouped in memory pages that are marked as read-only pages such that the controller 106, the main memory 102, and/or the host device 108 are prevented from writing to the memory cells 122 in these memory pages. These read-only memory pages often include code pages, cached file pages, and other memory pages storing data that is not expected to be modified for the life of the memory device 100. Because imprint is less of a concern in these memory pages (e.g., as the inability to change the data in these cells, or the difficulty thereof, is not anticipated to cause problems), the memory cells 122 in these pages do not need to be refreshed as regularly or as often as memory cells 122 in memory pages containing data that is frequently read, erased, and/or programmed (or even, in some embodiments, at all). Moreover and as described below, the controller 106, the main memory 102 (e.g., memory subsystems of the main memory), and/or the host device 108 can also convert memory pages of one classification and/or type of memory page to another classification and/or type of memory page. Therefore, it is desirable to track memory pages that have differing imprint-refresh schedules and that may require a less aggressive refresh schedule to lessen the energy and active time consumed by memory refresh operations.

As described in greater detail below, the system 101 utilizes a table 144 to track memory pages having differing imprint-refresh schedules (e.g., on a per memory die, memory unit 120, and/or memory block 128 basis). In the embodiment illustrated in FIG. 1, the table 144 is stored in the embedded memory 132 of the controller 106. In other embodiments, the table 144 can be stored at other locations (e.g., in addition to or in lieu of storing the table 144 on the embedded memory 132), such as on the main memory 102 and/or on the host device 108.

Figure 2B:
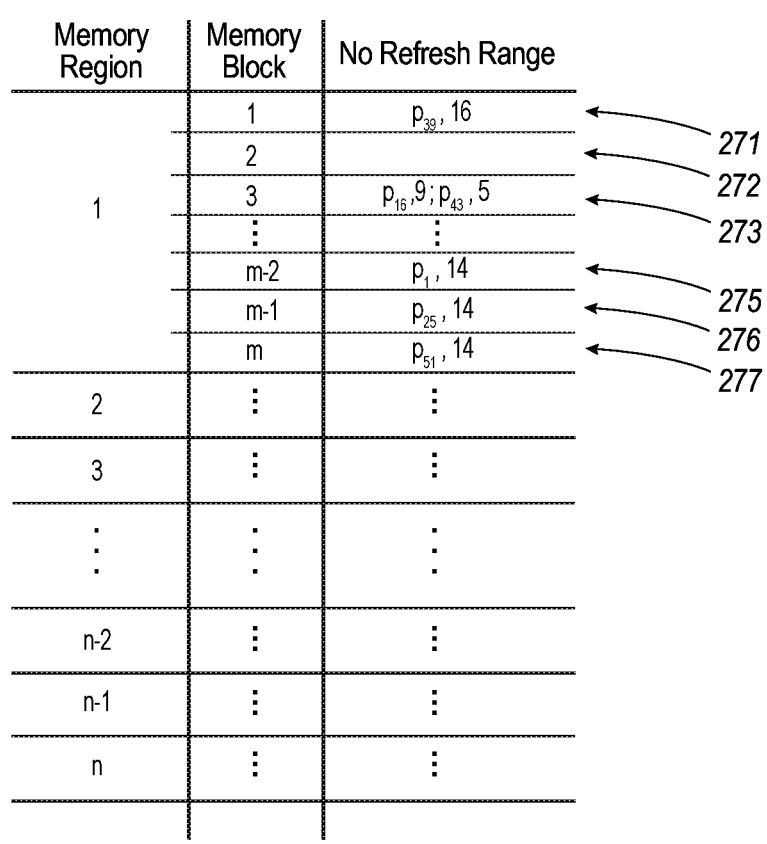

FIGS. 2A and 2B are tables illustrating selective page-based refresh in accordance with embodiments of the present technology. Referring to FIG. 2A, the memory device 100 (FIG. 1) and/or the host device 108 (FIG. 1) tracks ranges of memory pages that have been marked as no-refresh memory pages in an imprint-refresh schedule table 244a. As shown, the imprint-refresh schedule table 244a tracks memory pages in m number of memory blocks (e.g., memory blocks 128; FIG. 1) within n number of memory regions (e.g., memory dies and/or memory units 120; FIG. 1). In the illustrated embodiment, each memory block comprises 64 memory pages. In other embodiments, memory blocks may comprise a different number of memory pages (e.g., 10, 16, 32, 100, 128, 256, 512, 1048 memory pages).

The imprint-refresh schedule table 244a stores one or more ranges of memory pages in each memory block that do not need to be refreshed as frequently as other memory pages. For example, entry 251 in the imprint-refresh schedule table 244a corresponds to memory block 1 of memory region 1. In entry 251, memory pages 39 through 54 have been marked as no-refresh memory pages. Thus, the memory cells within memory pages 39 through 54 do not need to be refreshed as frequently as the memory cells within refresh memory pages 1 through 38 and 55 through 64 within memory block 1. Similarly, multiple no-refresh regions are recorded in entry 253, which corresponds to memory block 3 within memory region 1. Therefore, memory pages 16 through 24 and memory pages 43 through 47 in memory block 3 have been marked as no-refresh memory pages, and the memory cells in these no-refresh memory pages do not require frequent refresh operations. In contrast, entry 252, which corresponds to memory block 2 within memory region 1, is illustrated without a recorded no-refresh region. Thus, none of the memory pages within memory block 2 have been marked as no-refresh memory pages. As such, memory pages 1 through 64 of memory block 2 are refresh memory pages and undergo frequent and regular refresh operations.

As described in further detail below, the memory device 100 and/or the host device 108 can employ an algorithm to place memory pages of the same classification or type (e.g., refresh and/or no-refresh) in physically contiguous locations of memory, thereby limiting the number of ranges of memory pages and the number of memory pages in each range of memory pages that need to be stored in the imprint-refresh schedule table 244a. Limiting the number of no-refresh regions stored in the imprint-refresh schedule table 244a can minimize the amount of memory required to store the imprint-refresh schedule table 244a, which can permit the imprint-refresh schedule table 244a to be stored at locations with tight memory constraints. For example, entry 255 of the imprint-refresh schedule table 244a includes a no-refresh region that covers the same number of memory pages (i.e., 14 memory pages in total) as entry 253 of the imprint-refresh schedule table 244a. However, the algorithm has consolidated the no-refresh memory pages to the first 14 memory pages of memory block m-2, necessitating only one no-refresh region in entry 255 compared to two no-refresh regions in entry 253. Therefore, the amount of memory utilized for entry 255 is less than the amount of memory utilized for entry 253. In other embodiments, the algorithm can consolidate no-refresh memory pages to other physically contiguous locations of memory. For example, the algorithm can consolidate no-refresh memory pages to physically contiguous memory pages within a memory block and/or to physically contiguous memory pages located at the end of a memory block as illustrated in entries 256 and 257, respectively, of the imprint-refresh schedule table 244a.

Referring now to FIG. 2B, the memory device 100 and/or the host device 108 track ranges of memory pages that have been marked as no-refresh memory pages in an imprint-refresh schedule table 244b. The imprint-refresh schedule table 244b is similar to the imprint-refresh schedule table 244a except that the imprint-refresh schedule table 244b does not record the end page of each no-refresh region. Instead, the imprint-refresh schedule table 244b records the start page and length of each no-refresh region. For example, the no-refresh region recorded in entry 271 of the imprint-refresh schedule table 244b in FIG. 2B is the same as the no-refresh region recorded in entry 251 of the imprint-refresh schedule table 244a in FIG. 2A. However, the imprint-refresh schedule table 244b records the length of the no-refresh region (i.e., 16 memory pages beginning with memory page 39) rather than the end page of the memory region (i.e., memory page 54) recorded in the imprint-refresh schedule table 244a.

FIGS. 3A and 3B are tables 344a and 344b, respectively, illustrating alternative embodiments of selective page-based refresh in accordance with the present technology. In the illustrated embodiments, the memory device 100 and/or the host device 108 track ranges of memory pages that have not been marked as no-refresh memory pages in imprint-refresh schedule tables 344a and 344b. Thus, the imprint-refresh schedule tables 344a and 344b (FIGS. 3A and 3B) are similar to the imprint-refresh schedule tables 244a and 244b (FIGS. 2A and 2B), respectively, except that the imprint-refresh schedule tables 344a and 344b track memory pages that must be frequently refreshed (e.g., refresh memory pages) instead of memory pages that do not need to b e frequently refreshed (e.g., no-refresh memory pages). As shown in entries 355-357 in FIG. 3A and in entries 375-377 in FIG. 3B, the imprint-refresh schedule tables 344a and 344b can also benefit from consolidating no-refresh memory pages to physically contiguous memory locations so that the amount of memory required to store the imprint-refresh schedule tables 344a and 344b is minimal, which allows them to be stored at locations with tight memory constraints.

Although not shown in the embodiments illustrated in FIGS. 2A-3B, the imprint-refresh schedule tables 244a, 244b, 344a, and/or 344b can include additional columns and/or information in other embodiments. For example, the imprint-refresh schedule tables 244a, 244b, 344a, and/or 344b can include additional columns and/or information related to imprint-refresh schedules and/or imprint-refresh durations for individual memory pages, no-refresh regions, and/or refresh regions. In other words, the memory device 100 (FIG. 1) and/or the host device 108 (FIG. 1) can assign various imprint-refresh schedules and durations to memory pages and/or regions of memory pages depending on the classification or type (e.g., refresh, no-refresh, very-frequent refresh, frequent refresh, occasional refresh, etc.) of the memory pages and/or on other parameters (e.g., the physical location of a memory page in the main memory 102, a flag indicating that a memory page is free and available for immediate use, etc.). Examples of imprint-refresh schedules for no-refresh memory pages in accordance with the present technology include refreshing the no-refresh memory pages a fraction (e.g., 1/10, 1/4, 1/3, 1/2, 2/3, 3/4, 9/10) of as often as refreshing refresh memory pages to combat imprint effects. In other embodiments, imprint-refresh schedules for no-refresh memory pages can disallow refresh operations on the corresponding no-refresh memory pages altogether. In contrast, examples of imprint-refresh schedules in accordance with the present technology for no-refresh or other memory pages that are converted to another classification or type of memory page include refreshing these memory p age s at least as often as and/or a multiple of (e.g., 1.5, 2, 3, 5 times) as often as refreshing refresh memory pages to combat imprint effects. Furthermore, in some embodiments, the frequency of refresh operations scheduled for memory pages can be modified (e.g., increased and/or decreased) and/or updated in the corresponding imprint-refresh schedule tables. For example, the frequency of refresh operations for a memory page can be increased, e.g., if unwanted imprint effects are discovered in the memory cells of the memory page and/or the frequency of refresh operation for a memory page can be decreased, e.g., to accommodate system demand (e.g., to lessen the energy and/or active time consumed by memory refresh operations). In other embodiments, the memory device 100 and/or the host device 108 can make exceptions to the imprint-refresh schedules stored in the imprint-refresh schedule tables without modifying or updating the imprint-refresh schedules stored in the imprint-refresh schedule tables.

Moreover, although the embodiments illustrated in FIGS. 2A-3B are shown with only two classifications and types of memory pages (i.e., refresh memory pages and no-refresh memory pages), one or more imprint-refresh schedule tables (e.g., imprint-refresh schedule tables 244a, 244b, 344a, and/or 344b) can be used, in other embodiments, to track other classifications and/or types (e.g., very-frequent refresh, frequent refresh, occasional refresh, etc.) of memory pages in addition to or in lieu of refresh memory pages and/or no-refresh memory pages. For example, in some embodiments, a single imprint-refresh schedule table can be used to track a single classification or type of memory page such that there are as many imprint-refresh schedule tables as there are classifications and types of memory pages that are tracked. In other embodiments, a single imprint-refresh schedule table can be used to track all classifications and types of memory pages such that there is only one imprint-refresh schedule table for the memory device. In still other embodiments, one or more imprint-refresh schedule tables can be used to track one or more classifications and/or types of memory pages in designated memory regions (e.g., memory blocks, dies, and/or units) of the memory device.

Figure 4A:
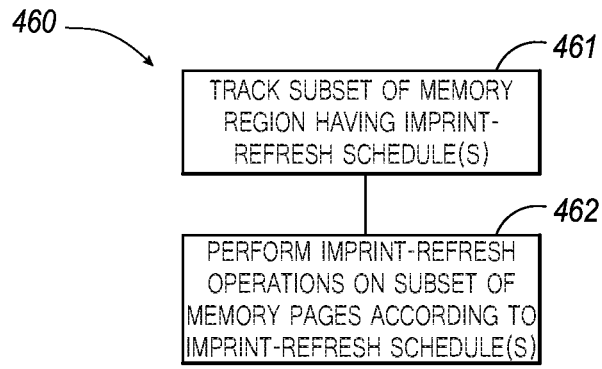
FIGS. 4A-4B are flow diagrams illustrating methods of operating a memory device in accordance with embodiments of the present technology.
Figure 4B:
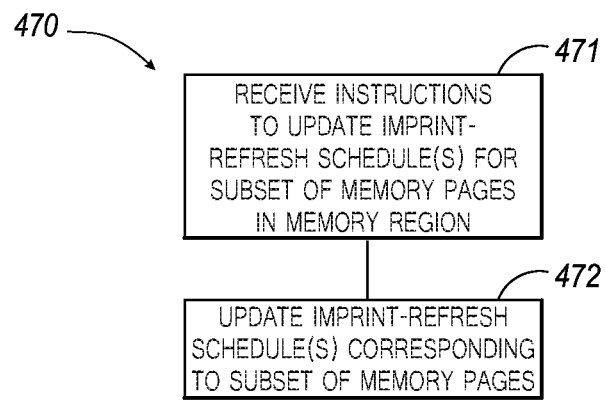
Figure 5A:
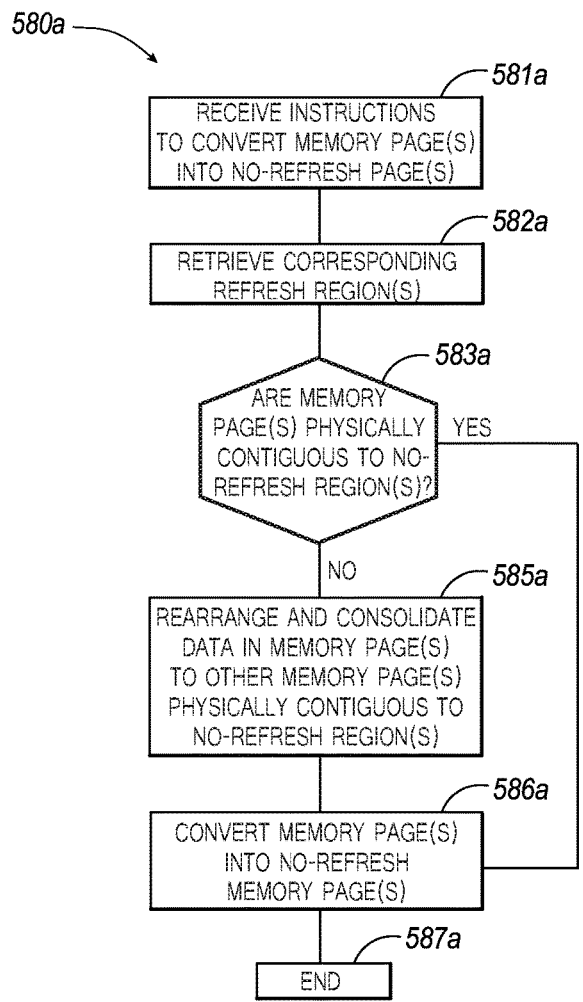
FIGS. 5A-5B are flow diagrams illustrating additional method of operating a memory device in accordance with embodiments of the present technology.
Figure 5B:
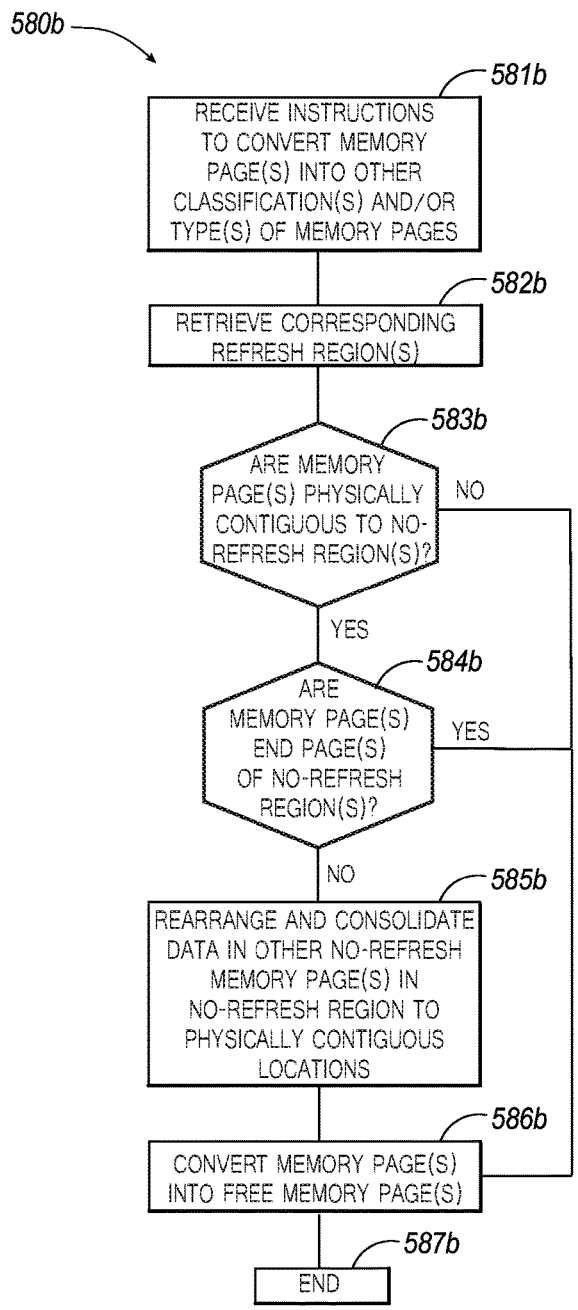

FIGS. 4-5B are flow diagrams illustrating routines 460, 470, 580a, and 580b respectively, for operating a memory device in accordance with an embodiment of the present technology. The routines 460, 470, 580a, and 580b can be executed, for example, by the controller 106 (FIG. 1), the main memory 102 (FIG. 1) (e.g., memory subsets of the main memory 102), and/or the host device 108 (FIG. 1).

Referring to FIG. 4A, the routine 460 determines whether to refresh memory p ages in a memory region by referring to an imprint-refresh schedule table stored, e.g., on the main memory 102 (FIG. 1), on the controller 106 (FIG. 1), and/or on the host device 108 (FIG. 1). In some embodiments, the imprint-refresh schedule table can be similar to the imprint-refresh schedule tables described in FIGS. 2A, 2B, 3A, and/or 3B. At block 461, the routine 460 begins by tracking, in the imprint-refresh schedule table, a subset of memory pages within the memory region having one or more imprint-refresh schedules based at least on the classifications and/or the type s (e.g., refresh, no-refresh, occasional-refresh, etc.) of memory pages within the sub set of memory pages. For example, in some embodiments, the routine 460 can assign an imprint-refresh schedule that prescribes refresh operations at periodic or regularly scheduled intervals (e.g., for refresh memory pages), refresh operations automatically after the occurrence of specific events (e.g., after a specified number of read, write, erase, or other system operations have occurred) or after a predetermined amount of time has elapsed (e.g. for occasional-refresh memory pages), and/or no refresh operations at all (e.g., for no-refresh memory pages). At block 462, the routine 460 can proceed to refresh the subset of memory pages in accordance with the one or more imprint-refresh schedules for the subset of memory pages.

Referring now to FIG. 4B, the routine 470 can update the one or more imprint-refresh schedules for the subset of memory pages in accordance with instructions received from, e.g., the controller 106 and/or the host device 108. In some embodiments, the instructions can be user prompted. In other embodiments, the instructions can be automatic. For example, the controller 106 and/or the host device 108 can send instructions to update the one or more imprint-refresh schedules automatically after the occurrence of specific events (e.g., after a specified number of read, write, erase, or other system operations have been performed on a memory page), after a memory page has gone unaccessed for a predetermined amount of time, and/or after unwanted imprint effects have been discovered in one or more memory cells of a memory page. At block 471, the routine 470 can receive imprint-refresh instructions containing, e.g., one or more logical addresses referencing memory pages within the subset of memory pages.

At block 472, the routine 470, in accordance with the received instructions, can update and/or modify the one or more imprint-refresh schedules corresponding to the memory pages referenced in the instructions. For example, the received instructions can direct the routine 470 to change the one or more imprint-refresh schedules stored in the imprint-refresh schedule table by increasing and/or decreasing the frequency and/or duration of refresh operations on the referenced memory pages (e.g., when the referenced memory pages are converted to a different classification and/or type of memory page, as discussed below with reference to FIGS. 5A and 5B below; when unwanted imprint effects are discovered in memory cells of the referenced memory pages; to accommodate system demand; and/or in accordance with a power schedule of the memory device). In these and other embodiments, the received instructions can direct the routine 470 to create exceptions to the one or more imprint-refresh schedules stored in the imprint-refresh schedule tab 1e without otherwise modifying the one or more imprint-refresh schedules. For example, the received instruction can direct the routine 470 to subject the referenced memory pages to temporary aggressive refresh operations (e.g., when the routine 470 anticipates converting the referenced memory pages to a different classification and/or type of memory page and/or when undesired imprint effects are discovered in the memory cells of the referenced memory pages).

Referring now to FIGS. 5A-5B, the routines 580a and 580b can consolidate no-refresh and/or other classification or types of memory pages to physically contiguous locations of memory (e.g., to minimize the memory space required to store the imprint-refresh schedule table(s)). The routine 580a can be executed to convert memory pages into no-refresh memory pages. In contrast, the routine 580b can be executed to convert memory pages (e.g., no-refresh memory pages) into other classification(s) and/or type(s) of memory pages.

Referring now to FIG. 5A, the routine 580a begins by receiving instructions to convert one or more memory pages (e.g., refresh and/or other classifications and/or types of memory pages) into no-refresh memory page(s) (block 581a). At block 582a, the routin e 580 a can retrieve corresponding no-refresh region(s) (e.g., of selected memory blocks, memory dies, and/or memory units) from an imprint-refresh schedule table stored, for example, on the controller 106, on the main memory 102, and/or on the host device 108. The routine 580a proceeds to determine whether the one or more memory pages are located at physically contiguous locations to the corresponding no-refresh region(s) (decision block 583a). If the routine 580a determines that the one or more memory pages are located at physically contiguous locations to the corresponding no-refresh region(s), the routine 580a can convert the one or more memory pages into no-refresh memory page(s) (block 586a) and can proceed to block 587a. In some embodiments, the routine 580a can return a success message before proceeding to block 587a.

On the other hand, if the routine 580a determines that the one or more memory pages are not located at physically contiguous locations to the corresponding no-refresh region(s) (decision block 583a), the routine 580a can relocate, rearrange, and/or consolidate the data stored in the one or more memory pages and/or in the corresponding no-refresh region(s) to physically contiguous memory locations (block 585a). In some embodiments, the routine 580a can convert no-refresh memory pages in the corresponding no-refresh region(s) to refresh and/or other classification and/or types of memory pages and/or vice versa when relocating the data stored in the no-refresh memory pages of the no-refresh memory region(s). After the routine 580a relocates, rearranges, and/or consolidates the data stored in the one or more memory page(s) and/or in the no-refresh memory pages in the corresponding no-refresh region(s) to physically contiguous memory locations, the routine 580a can convert the one or more memory pages and/or the memory pages containing their relocated data into no-refresh memory pages (block 586a) and can proceed to block 587a. In some embodiments, the routine 580a can return a success message before proceeding to block 587a.

Referring now to FIG. 5B, the routine 580b is similar to the routine 580a of FIG. 5A with few exceptions. As discussed above, the routine 580b can be executed to convert memory pages (e.g., no-refresh memory pages) into refresh and/or other classifications and/or types of memory pages. The routine 580b begins by receiving instructions to convert one or more no-refresh memory pages into other classification(s) and/or type(s) of memory pages (block 581a). At block 582b, the routine 580b retrieves the corresponding no-refresh region(s) from an imprint-refresh schedule table stored, for example, on the main memory 102, on the controller 106, and/or on the host device 108.

At decision block 583b, the routine 580b determines whether the one or more no-refresh memory pages are physically contiguous to the corresponding no-refresh region(s). For example, in some embodiments, the routine 580b can determine that the one or more no-refresh memory pages have not previously been consolidated to physically contiguous memory locations with respect to the corresponding no-refresh region and, thus, are not physically contiguous to the corresponding no-refresh region(s). In other embodiments, the routine 583b can determine whether the one or more no-refresh memory pages are physically contiguous to the corresponding no-refresh region(s) by determining whether the one or more no-refresh memory pages span the entire length of the corresponding no-refresh region(s). If the one or more memory pages do not span the entire length of the corresponding no-refresh region(s), then the routine 580b can determine that the one or more memory pages are physically contiguous to the corresponding no-refresh region(s). On the other hand, if the one or more memory pages span the entire length of the corresponding no-refresh region(s), then the routine 580b can determine the one or more memory pages are not physically contiguous to the corresponding no-refresh region(s).

If the routine 580b determines that the one or more no-refresh memory pages are not located at physically contiguous locations to the corresponding no-refresh region(s), the routine 580b can convert the one or more no-refresh memory pages into other classification(s) and/or type(s) of memory pages (block 586b) and can proceed to block 587b. In some emb odiments, the routine 580b can return a success message before proceeding to block 587b. On the other hand, if the routine 580b determines that the one or more no-refresh memory pages are located at physically contiguous locations to the corresponding no-refresh region(s) (decision block 583b), the routine 580b can proceed to determine whether the one or more no-refresh memory pages are located at either a start (e.g., a start memory page) or an end (e.g., an end memory page) of the corresponding no-refresh region(s) (decision block 584b). If the routine 580b determines that the one of more no-refresh memory pages are a start and/or an end of the corresponding no-refresh region(s), the routine 580b can convert the one or more no-refresh memory pages into other classification(s) and/or type(s) of memory pages (block 586b) and can proceed to block 587b. In some embodiments, the routine 580b can return a success message before proceeding to block 587b.

If the routine 580b determines that the one or more no-refresh memory pages are not located at either a start (e.g., a start page) or an end (e.g., an end page) of the corresponding no-refresh region(s) (e.g., the routine 580b determines that the one or more no-refresh memory pages are located at inner no-refresh memory pages of the corresponding no-refresh region(s)) (decision block 584b), the routine 580b can relocate, rearrange, and/or consolidate the data stored in the one or more no-refresh memory pages and/or in no-refresh memory pages in the corresponding no-refresh region(s) to physically contiguous memory locations (block 585b). In some embodiments, the routine 580b can convert no-refresh memory pages in the corresponding no-refresh region(s) to other classification(s) and/or type(s) of memory pages and/or vice versa when relocating the data stored in the no-refresh memory pages of the no-refresh region(s). After the routine 580b relocates, rearranges, and/ or consolidates the data stored in the one or more no-refresh memory page(s) and/or in the no-refresh memory pages in the corresponding no-refresh region(s) to physically contiguous memory locations, the routine 580b can convert the one or more no-refresh memory pages and/or the memory pages containing their relocated data into other classification(s) and/or type(s) of memory pages (block 586b) and can proceed to block 587b. In some embodiments, the routine 580b can return a success message before proceeding to block 587b.

Figure 6:
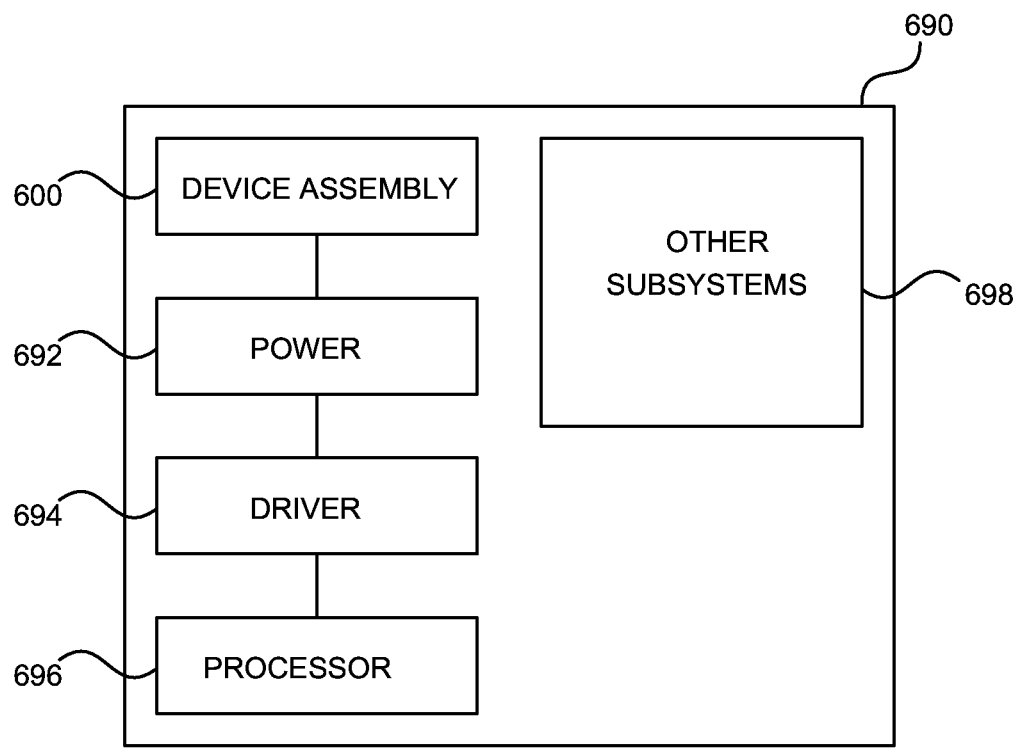
FIG. 6 is a schematic view of a system that includes a memory device in accordance with embodiments of the present technology.

FIG. 6 is a schematic view of a system that includes a memory device in accordance with embodiments of the present technology. Any one of the foregoing memory devices described above with reference to FIGS. 1-5B can be incorporated into any of a myriad of larger and/or more complex systems, a representative example of which is system 690 shown schematically in FIG. 6. The system 690 can include a semiconductor device assembly 600, a power source 692, a driver 694, a processor 696, and/or other subsystems and components 698. The semiconductor device assembly 600 can include features generally similar to those of the memory device described above with reference to FIGS. 1-5B, and can, therefore, include various features of selective page-based refresh. The resulting system 690 can perform any of a wide variety of functions, such as memory storage, data processing, and/or other suitable functions. Accordingly, representative systems 690 can include, without limitation, hand-held devices (e.g., mobile phones, tablets, digital readers, and digital audio players), computers, vehicles, appliances, and other products. Components of the system 690 may be housed in a single unit or distributed over multiple, interconnected units (e.g., through a communications network). The components of the system 690 can also include remote devices and any of a wide variety of computer readable media.

From the foregoing, it will be appreciated that specific embodiments of the invention have been described herein for purposes of illustration, but that various modifications may be made without deviating from the disclosure. For example, although not shown in FIG. 5B, the routine 580b, in some embodiments, can relocate, rearrange, and/or consolidate data in other classification(s) and/or type(s) of memory pages (e.g., refresh memory pages, occasional-refresh memory pages, etc.) to physically contiguous memory locations with respect to regions of the corresponding classification(s) and/or type(s) of memory pages. In doing so, the routine 580b can convert memory pages into other classification(s) and/or type(s) of memory pages. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

I claim:

1. A method of managing a memory device, the method comprising:
  receiving instructions to assign a first memory region a first refresh schedule, wherein the first memory region is currently assigned a second refresh schedule different from the first refresh schedule, and wherein the first refresh schedule corresponds to never refreshing corresponding memory regions;
  determining that a second memory region physically contiguous to the first memory region is assigned a third refresh schedule that is not the first refresh schedule;
  determining that a third memory region is assigned the first refresh schedule;
  writing data currently stored in first memory cells of the third memory region to second memory cells of the second memory region; and
  assigning the first memory region and the second memory region the first refresh schedule.

2. The method of claim 1, wherein writing the data includes moving the data from the first memory cells to the second memory cells.

3. The method of claim 1, wherein:
  the data is first data; and
  the method further comprises moving second data from the second memory cells of the second memory region to the first memory cells of the third memory region.

4. The method of claim 1, further comprising assigning the third memory region the third refresh schedule.

5. The method of claim 4, wherein the third refresh schedule is the second refresh schedule.

6. The method of claim 4, wherein the third refresh schedule is not the second refresh schedule.

7. The method of claim 1, further comprising retrieving, from a table stored on the memory device or on a memory system including the memory device, a list of memory regions currently assigned the first refresh schedule.

8. The method of claim 7, wherein determining that the second memory region physically contiguous to the first memory region is assigned the third refresh schedule is based at least in part on the list of memory regions currently assigned to the first refresh schedule.

9. The method of claim 7, wherein determining that the third memory region is assigned the first refresh schedule is based at least in part on the list of memory regions currently assigned to the first refresh schedule.

10. A method of managing a memory device, the method comprising:
  receiving instructions to assign a first memory region a first refresh schedule, wherein the first memory region is currently assigned a second refresh schedule different from the first refresh schedule, and wherein the second refresh schedule corresponds to never refreshing corresponding memory regions;
  determining that a second memory region physically contiguous to the first memory region is assigned the second refresh schedule;
  determining that a third memory region is assigned the second refresh schedule and that a fourth memory region physically contiguous the third memory region is assigned the first refresh schedule;
  writing data currently stored in first memory cells of the second memory region to second memory cells of the fourth memory region;
  assigning the fourth memory region the second refresh schedule; and
  assigning the first and second memory regions the first refresh schedule.

11. The method of claim 10, wherein writing the data includes moving the data from the first memory cells to the second memory cells.

12. The method of claim 10, wherein:
the data is first data; and
the method further comprises moving second data from the second memory cells of the fourth memory region to the first memory cells of the second memory region.

13. The method of claim 10, further comprising retrieving, from a table stored on the memory device or on a memory system including the memory device, a list of memory regions currently assigned the first refresh schedule.

14. The method of claim 13, wherein determining that the second memory region and the third memory region are assigned the second refresh schedule is based at least in part on the list of memory regions currently assigned to the first refresh schedule.

15. The method of claim 10, wherein:
the first memory region and the second memory region define at least in part a first no-refresh region of the memory device; and
the method further comprises determining whether the first memory region spans an entire length of the first no-refresh region.

16. The method of claim 15, wherein determining whether the first memory region spans the entire length of the first no-refresh region includes determining that the first memory region does not span the entire length of the first no-refresh region.

17. The method of claim 10, wherein:
the first memory region and the second memory region define at least in part a first no-refresh region of the memory device; and
the method further comprises determining that the first memory region if located at a beginning or an end of the first no-refresh region such that a fifth memory region physically contiguous to the first memory region is not assigned the second refresh schedule.

18. The method of claim 10, wherein:
the memory device includes a fifth memory region physically contiguous the first memory region such that the first memory region is positioned between the fifth memory region and the second memory region;
the fifth memory region, the first memory region, and the second memory region define at least in part a first no-refresh region of the memory device; and
the method further comprises determining that the first memory region is not positioned at a beginning or an end of the first no-refresh region.

19. The method of claim 18, wherein:
the data is first data; and
the method further comprises writing second data currently stored in third memory cells of the fifth memory region to fourth memory cells of a sixth memory region physically contiguous to the third memory region or the fourth memory region.

20. A method of managing a memory device, the method comprising:
receiving instructions to assign a first memory region a first refresh schedule, wherein the first memory region is currently assigned a second refresh schedule different from the first refresh schedule, and wherein the first refresh schedule corresponds to never refreshing corresponding memory regions;
determining that a second memory region physically contiguous to the first memory region is assigned the first refresh schedule; and
based at least in part on the determination that the second memory region is assigned the first refresh schedule, assigning the first memory region the first refresh schedule.

* * * * *